(12) United States Patent
Wimmer et al.

(10) Patent No.: US 6,664,802 B2
(45) Date of Patent: Dec. 16, 2003

(54) SYSTEM AND METHOD FOR DIAGNOSING FAULT CONDITIONS ASSOCIATED WITH POWERING AN ELECTRICAL LOAD

(75) Inventors: Richard Wimmer, Sunnyvale, CA (US); Stanley Chan, Sterling Heights, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/872,006

(22) Filed: Jun. 1, 2001

(65) Prior Publication Data

US 2001/0048367 A1 Dec. 6, 2001

Related U.S. Application Data

(60) Provisional application No. 60/209,436, filed on Jun. 2, 2000.

(51) Int. Cl.$^7$ ............................................. G01R 31/34
(52) U.S. Cl. ...................... 324/772; 324/771; 324/158.1
(58) Field of Search ............................. 324/771, 158.1, 324/772, 545; 361/86, 91.5, 152, 154, 170, 187; 318/440; 322/99; 123/319; 327/172–177

(56) References Cited

U.S. PATENT DOCUMENTS

| | | | | |
|---|---|---|---|---|
| 4,932,246 A | * | 6/1990 | Deutsch et al. ............ 73/119 A |
| 5,409,258 A | * | 4/1995 | Kawabata ................... 280/735 |
| 5,459,449 A | * | 10/1995 | Ravas et al. ................ 340/438 |
| 5,659,474 A | * | 8/1997 | Maeno et al. ................. 701/45 |
| 5,666,065 A | * | 9/1997 | Ravas et al. ................ 324/769 |
| 5,811,947 A | * | 9/1998 | Hurst et al. ................. 318/370 |
| 5,872,460 A | * | 2/1999 | Bennett et al. ............. 324/769 |
| 6,147,848 A | * | 11/2000 | Boggs et al. ................ 323/283 |
| 6,317,458 B1 | * | 11/2001 | Boggs et al. ................ 323/276 |

OTHER PUBLICATIONS

International Search Report mailed Feb. 11, 2002.

* cited by examiner

Primary Examiner—Kamand Cuneo
Assistant Examiner—Tung X. Nguyen

(57) ABSTRACT

The inventive method and system permits diagnosing the type of fault condition associated with powering an electrical load that has a high side driver portion and a low side driver portion. Selectively powering the driver portions in different combinations and sampling a plurality of associated diagnostic feedback signals associated with each of the driver portions permits diagnosing the type of fault present. In one example, three different powering combinations and three different diagnostic feedback signals are used. This example permits diagnosing one of seven different possible fault conditions.

21 Claims, 3 Drawing Sheets

SYSTEM AND METHOD FOR DIAGNOSING FAULT CONDITIONS ASSOCIATED WITH POWERING AN ELECTRICAL LOAD

CROSS REFERENCE TO RELATED APPLICATIONS

This application claims priority to U.S. provisional application Ser. No. 60/209,436, which was filed on Jun. 2, 2000.

BACKGROUND OF THE INVENTION

This invention generally relates to diagnosing fault conditions associated with powering electrical loads.

A variety of electrically powered components are typically provided on motorized vehicles. Examples includes electric motors that are used for actuating various vehicle components. Other example loads include motor brakes. It is not uncommon to experience difficulty in powering such loads. While recognizing when a fault condition occurs is not always difficult, there has not been a way of accurately determining the nature or cause of the fault condition.

There is a need for being able to determine the type of fault condition present in a particular circumstance. For example, it is useful to determine whether a fault condition is associated with a short across the load or a short to ground from one side of the load, for example. Prior to this invention there has not been an effective and efficient way to determine the cause or nature of a fault condition.

SUMMARY OF THE INVENTION

In general terms, this invention is a method and system for diagnosing a fault condition associated with powering an electrical load where the electrical load includes a high side driver portion and a low side driver portion.

In a method of this invention, the high side driver portion and low side driver portion are selectively powered in a plurality of combinations. Example combinations include no power to both driver portions, power only to the high side driver portion and power to both of the driver portions.

During each of the selected powering combinations, at least one voltage associated with the high side driver portion is sampled. At least one voltage associated with the low side driver portion is also sampled during each of the selected combinations. The sampled voltages provide information that is used to diagnose the type of fault present under given circumstances.

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
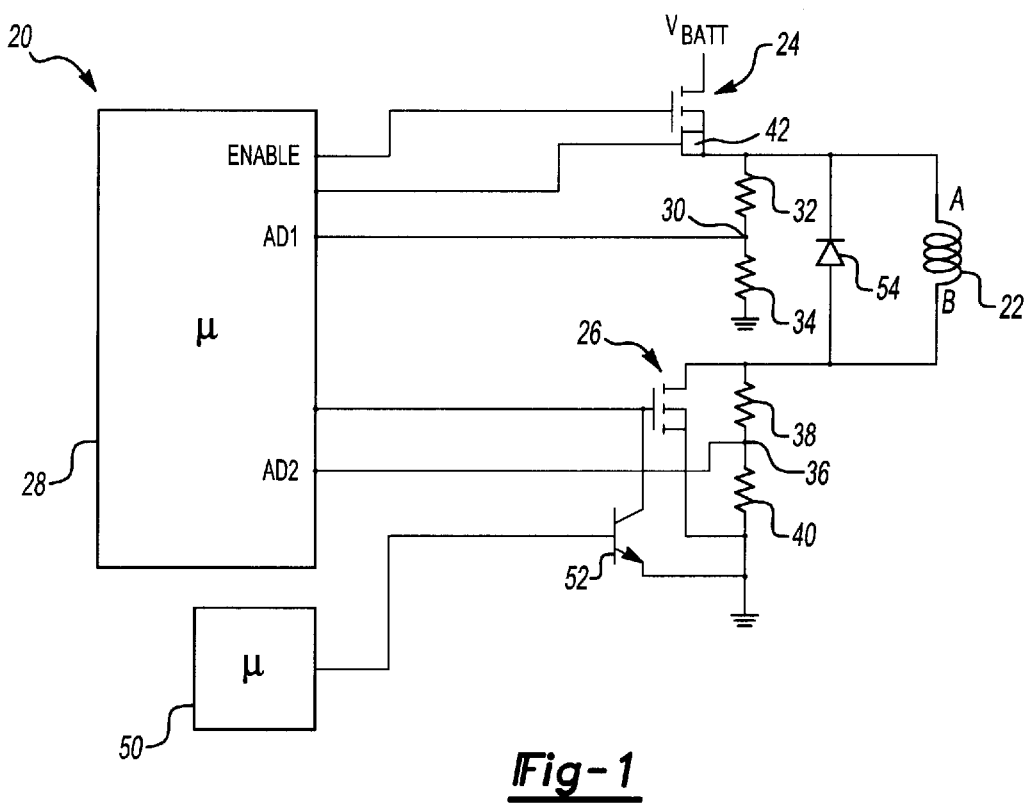
FIG. 1 schematically illustrates a system designed according to this invention.

A system 20 for powering an electrical load 22 includes a high side driver portion 24 and a low side driver portion 26. The illustrated arrangement is a half-bridge configuration for powering the load 22. An inductive load 22 is illustrated for discussion purposes. The type of electrical load 22 for which this invention is useful can take many forms. One example includes an electric motor brake. This invention is particularly believed to be useful for diagnosing fault conditions associated with electrical loads that are associated with controlling components on motorized vehicles.

A microprocessor 28 preferably is programmed to enable the high side driver portion 24 and low side driver portion 26 for powering the load 22. The microprocessor 28 preferably is also programmed to selectively provide power to the driver portions 24 and 26 in a plurality of combinations. Example combinations include no power to either driver portion, power to only the high side driver portion 24 and power to both of the driver portions 24 and 26.

During each of the combinations of providing power to the driver portions, the microprocessor 28 preferably gathers information regarding the operation of the circuitry 20. The microprocessor 28 preferably samples at least one voltage associated with the high side driver portion 24. In the illustrated example, a test voltage AD1 is sampled from the node 30. The AD1 voltage is taken from a voltage divider including resistors 32 and 34.

Another voltage preferably is sampled by the microprocessor 28 from the node 36. This second sample voltage signal is referred to as AD2 in this discussion and is the voltage associated with the low side driver portion 26. The value of the AD2 voltage is provided by the voltage divider including resistive elements 38 and 40.

In the illustrated example, the sampled voltages preferably are converted to digital signals by an analog-to-digital converter within the microprocessor 28. The thresholds at which a sampled voltage is considered a logical high or low will depend on the specific arrangement of components used in a given situation.

A third signal preferably is gathered from a status bit 42 associated with the high side driver 24. In one example, the status bit 42 is the status bit from a BTS426L component associated with the high side driver portion 24. The status bit is a known switch function that responds to a fault condition detectable at the high side driver portion 24.

The microprocessor 28 preferably is programmed to utilize at least the diagnostic feedback signals obtained at 30 and 36 to diagnose a plurality of fault conditions associated with powering the load 22. The diagnostic feedback signal obtained from the status bit 42 preferably is used for diagnosing at least one type of potential fault condition. The nature or cause of the fault condition, in part, dictates the number of signals required to make an accurate diagnosis. Those skilled in the art who have the benefit of this description will be able to determine which and how many signals are needed for their particular situation.

A monitoring microprocessor 50 preferably controls an npn transistor 52 depending on the presence of a fault condition. Whenever a fault condition is present, the transistor 52 preferably is activated such that the enable signal to the low side driver portion 26 is coupled to ground, which inhibits powering the load 22. A recirculation diode 54 preferably is included in the circuitry to control energy dissipation while deenergizing the load 22.

This invention provides the capability of not only detecting when there is a fault condition but, moreover, diagnosing the type of fault condition present.

Figure 2:
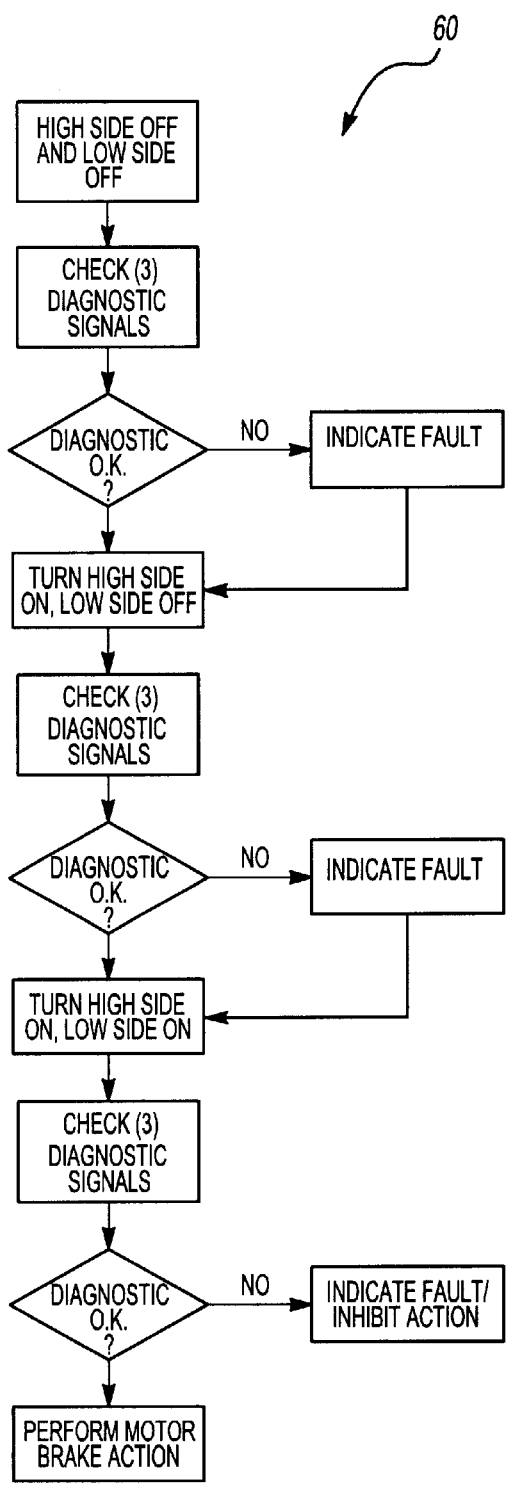
FIG. 2 illustrates in flow chart form a methodology of this invention.

The flow chart 60 in FIG. 2 summarizes an approach that is consistent with this invention for diagnosing fault conditions. The driver portions 24 and 26 first preferably are not powered. This can be referred to as a first powering combination of the driver portions. Each of the diagnostic signals preferably are then sampled by the microprocessor 28. When a fault condition is located at this point, the microprocessor 28 preferably is programmed to provide a fault indication.

Once the results using the first powering combination are obtained, the second powering combination preferably is implemented. In one example, the high side driver 24 is powered while the low side driver portion 26 is off. The diagnostic feedback signals are then sampled and checked to determine whether a fault condition is present. If no fault condition was located using the first powering combination but is located with the second combination, an indication of a fault preferably is provided once located. Even when a fault is located upon using the first and second powering combinations, a third combination preferably is implemented.

In the illustrated example, the third powering combination includes powering the high side driver portion 24 and the low side driver portion 26. The diagnostic feedback signals preferably are sampled by the microprocessor 28 under the third powering combination conditions. If no fault has been located to this point, the load 22 is powered as desired. In one example, motor brake action is performed as needed. When a fault condition is found, after the powering combinations for diagnosis are complete, an indication of the fault preferably is provided along with inhibiting the requested action.

Some fault conditions may be diagnosed accurately after the first and second powering combinations are utilized. Other fault conditions, however, may not become apparent until the third powering combination is implemented. Therefore, with the illustrated example, it is most preferred to use all three powering combinations even if the results of sampling the signals after the first or second combinations indicates a fault condition. The microprocessor 28 preferably is programmed to recognize a fault condition as soon as one of the sampled signals does not match an expected result. The microprocessor 28 preferably is also programmed to continue sampling the signals under the different powering combinations until the fault condition is accurately diagnosed. Some fault conditions may become apparent after one or two powering combinations are utilized while other fault conditions may not be accurately diagnosed until at least three different powering conditions are implemented with the illustrated example.

Utilizing a combination of feedback signals along with the various powering combinations for powering the high and low side driver portions provides the ability to diagnose a plurality of fault conditions. Example fault conditions include an open circuit associated with the lead A of the load 22, an open circuit associated with the lead B of the load 22, a short to the battery at the lead A, a short to the battery at the lead B, a short to ground at the lead A, a short to ground at the lead B, and a short across the load 22.

Figure 3:
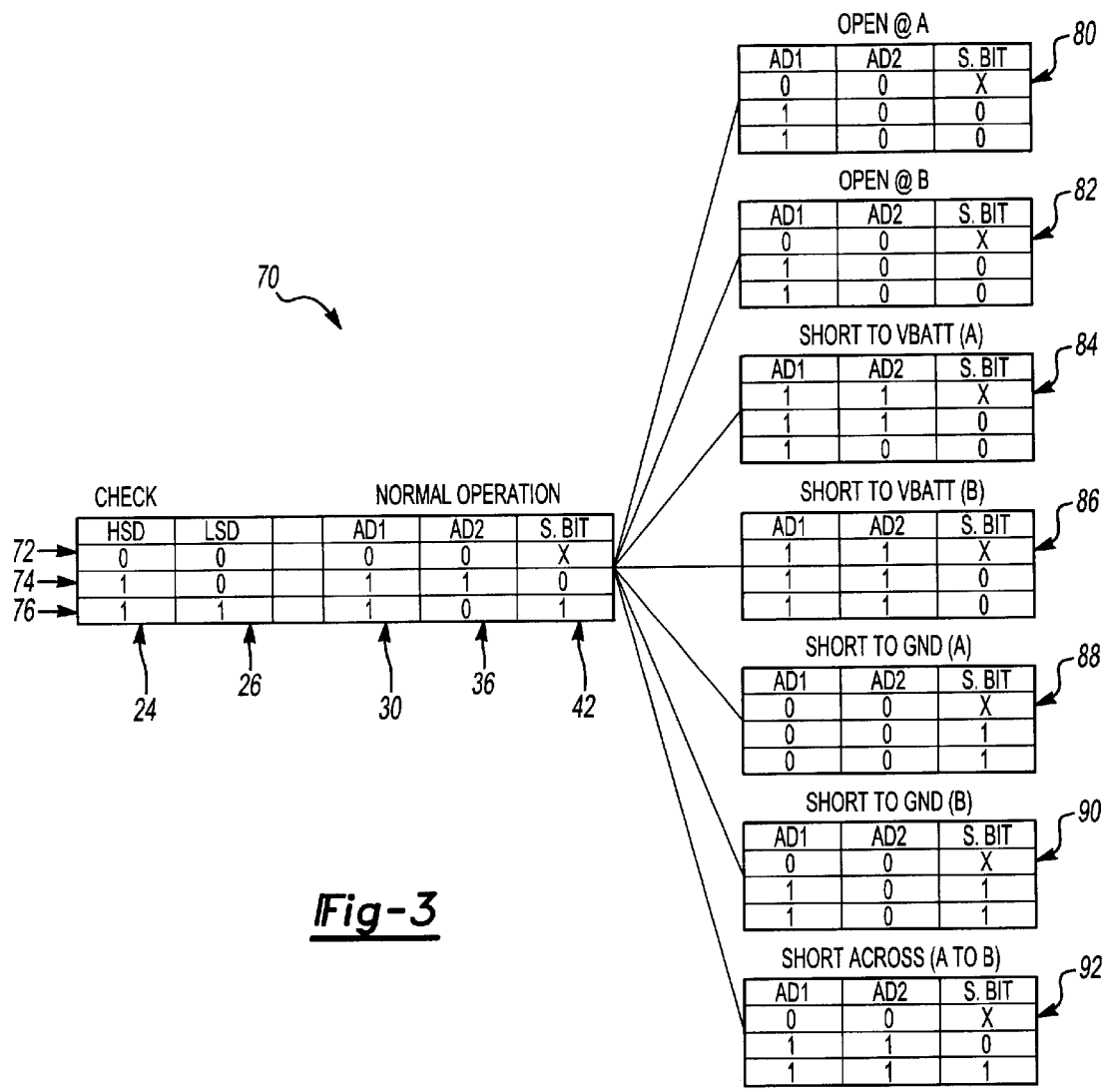
FIG. 3 schematically illustrates a diagnosing strategy according to this invention.

FIG. 3 schematically illustrates one example way of utilizing a combination of the feedback signals and a plurality of powering combinations for diagnosing the type of fault condition.

A first powering combination state is illustrated at 72. Under these conditions, the high side driver portion 24 and low side driver portion 26 have a logical value of zero, which corresponds to them being off. The diagnostic feedback signals AD1, AD2 taken from the nodes 30 and 36, respectively, preferably are converted to digital signals by the microprocessor 28. Accordingly, the feedback signals receive logical values consistent with the voltage value at the appropriate points in the circuitry. Selecting the threshold associated with whether the voltage value constitutes a logical LOW or HIGH depends upon the needs of a particular situation. Those skilled in the art who have the benefit of this description will be able to select appropriate voltage levels. The status bit feedback signal provides a logical HIGH or LOW depending on the status. An "X" in FIG. 3 indicates that the value of the corresponding signal is not needed under those conditions.

Second and third powering combinations are shown at 74 and 76, respectively.

The powering combination 74 corresponds to the high side driver 24 being turned on with the low side driver portion 26 off. The powering combination 76 corresponds to both driver portions being turned on.

The expected value for the feedback signals are shown as "normal operation" corresponding to each of the powering combinations. The right hand side of FIG. 3 shows possible actual values of the diagnostic feedback signals and the associated fault condition indicated by those values. The microprocessor 28 preferably has memory (or access to external memory) and is programmed to diagnose a fault condition by comparing actual signal values to the expected values. For example, when a feedback signal at the node 36 is not as expected while the high side driver is on and the low side driver is off (powering combination 74) and the status bit is not as expected when both driver portions are on (powering combination 76), that indicates an open circuit at the lead A or B of the load 22. This is illustrated at 80 and 82 of FIG. 3.

When the actual values of the diagnostic feedback signals are as illustrated at 84, the microprocessor 28 determines that there is a short to battery at the lead A of the load 22. Similarly, when the values are as illustrated at 86, the microprocessor 28 determines that there is a short to battery at the lead B of the load 22.

A fault condition including a short to ground from the lead A results in feedback signal values as illustrated at 88 while a short to ground at the lead B provides signal values as illustrated at 90. The microprocessor 28 determines that there is a short across the load 22 when the feedback signal values are as illustrated at 92.

The microprocessor 28 preferably is programmed to recognize the plurality of fault conditions based upon the different signal values under the different powering combinations. As can be appreciated from the truth table arrangement illustrated in FIG. 3, at least two feedback signals preferably are used to diagnose most of the fault conditions. The status bit feedback signal at 42 is necessary for determining the fault conditions illustrated at 90 and 92, for example. For the fault conditions including an open circuit at either end of the load or a short to battery to either end of the load, only the two feedback signals taken from the nodes 30 and 36 are necessary.

Of course, the signal values illustrated in FIG. 3 correspond to a circuitry arrangement as illustrated in FIG. 1. By altering the circuitry, different values for the signals could provide different indications of different fault conditions. Given this description, those skilled in the art will be able to appropriately program a microprocessor 28 to accurately diagnose a variety of fault conditions based upon a plurality of feedback signals sampled during a plurality of combinations of powering the high and low side driver portions for their specific circuitry.

The preceding description is exemplary rather than limiting in nature. Variations and modifications to the disclosed example may become apparent to those skilled in the art that do not necessarily depart from the essence of this invention. The scope of legal protection given to this invention can only be determined by studying the following claims.

We claim:

1. A method of diagnosing a fault condition associated with powering an electrically driven load having a high side driver portion and a low side driver portion, comprising the steps of:

(A) selectively powering the high and low side driver portions in a plurality of combinations;

(B) sampling at least one signal associated with the high side driver portion during each of the combinations;

(C) sampling at least one signal associated with the low side driver portion during each of the combinations; and (D) determining whether a fault condition exists and diagnosing the fault condition using a combination of the sampled voltages.

2. The method of claim 1, wherein step (A) includes supplying no power to either of the driver portions as a first combination, supplying power only to the high side driver portion as a second combination and supplying power to both driver portions as a third combination.

3. The method of claim 2, wherein step (D) includes comparing the sampled signals to expected signals corresponding to at least one of the combinations of step (A).

4. The method of claim 2, wherein step (A) includes powering the high and low side driver portions using each of the first, second and third combinations and step (D) includes comparing the sampled signals to expected signal values for each of the combinations.

5. The method of claim 1, including sampling a third signal that is associated with the high side driver portion.

6. The method of claim 5, wherein the sampled signals include a status bit indicator associated with the high side driver portion, a voltage associated with the low side driver portion and a voltage associated with the high side driver portion.

7. The method of claim 1, wherein steps (B) and (C) include sampling voltages associated with the high and low side driver portions, respectively, and converting the voltages into digital signals having logic values that correspond to a magnitude of the sampled voltage.

8. The method of claim 1, including using a test signal voltage to power the high and low side driver portions while performing step (A), the test signal voltage being different than a voltage used to power the electrically driven load.

9. The method of claim 1, including sampling a voltage value when performing steps (B) and (C).

10. The method of claim 1, including performing steps (A) through (D) before providing power to the load.

11. A system for diagnosing a fault condition associated with an electrically powered load, comprising:

a high side driver portion;

a low side driver portion;

a controller that selectively enables the driver portions in a plurality of powering combinations and that samples at least one signal associated with each driver portion during each of the powering combinations and determines whether a fault condition exists and diagnoses the fault condition using the sampled signals associated with the powering combinations.

12. The system of claim 11, wherein the high and low side driver portions are arranged in a half-bridge configuration.

13. The system of claim 11, including a voltage divider associated with the high side driver portion that provides the signal associated with the high side driver portion and a second voltage divider that provides the signal associated with the low side driver portion.

14. The system of claim 13, wherein the controller converts the sampled voltages into digital signals having logic values corresponding to a magnitude of the corresponding voltage.

15. The system of claim 11, wherein the high side driver portion includes a switch status bit and the controller uses a value of the status bit as a third signal when determining whether a fault condition exists and for diagnosing the type of fault condition.

16. The system of claim 11, including a selectively activated switch coupled between the low side driver and a ground, the controller selectively activating the switch to ground the low side driver when a fault condition is detected.

17. The system of claim 11, including a memory portion that contains expected signal values associated with each of the plurality of combinations for powering the high and low side driver portions and the controller compares the sampled signals to the expected values to determine when a fault condition exists and to diagnose the fault condition.

18. The system of claim 11, wherein the controller powers the high side and low side driver portions using at least three combinations including a first combination where no power is supplied to either driver portion, a second combination where the high side driver portion is on and the low side driver portion is off and a third combination where the high and low side driver portions are on.

19. The system of claim 11, wherein the controller enables the driver portions using a test signal voltage that is different than a voltage used to power the electrically powered load.

20. The system of claim 11, wherein the at least one signal sampled by the controller comprises a digital signal having a logic value corresponding to a voltage.

21. The system of claim 11, including an electric motor brake that is selectively powered by the controller controlling the driver portions.

* * * * *